United States Patent [19]

Bingham

[11] Patent Number: 4,777,580
[45] Date of Patent: Oct. 11, 1988

[54] INTEGRATED FULL-WAVE RECTIFIER CIRCUIT

[75] Inventor: David Bingham, San Jose, Calif.

[73] Assignee: Maxim Integrated Products, Sunnyvale, Calif.

[21] Appl. No.: 920,891

[22] Filed: Oct. 16, 1986

Related U.S. Application Data

[63] Continuation of Ser. No. 696,372, Jan. 30, 1985, abandoned.

[51] Int. Cl.⁴ .................................. H02M 7/217
[52] U.S. Cl. .................................. 363/127; 363/147
[58] Field of Search ............... 363/89, 127, 128, 147

[56] References Cited

U.S. PATENT DOCUMENTS

| | | | |
|---|---|---|---|
| 3,509,446 | 4/1970 | Mullaly | 363/147 |
| 3,588,671 | 6/1971 | Deboo | 363/127 |
| 3,909,700 | 9/1975 | Ferro | 363/147 |
| 4,172,279 | 10/1979 | Stein | 363/147 |
| 4,276,592 | 6/1981 | Goldman et al. | 363/127 |
| 4,319,144 | 3/1982 | King et al. | 363/127 |
| 4,473,757 | 9/1984 | Farago et al. | 363/127 |
| 4,485,348 | 11/1984 | Perkins | 363/127 |
| 4,535,203 | 8/1985 | Jenkins et al. | 363/127 |

Primary Examiner—Patrick R. Salce
Assistant Examiner—Jeffrey Sterrett
Attorney, Agent, or Firm—Blakely, Sokoloff, Taylor & Zafman

[57] ABSTRACT

A full-wave rectifier circuit is disclosed having two AC input terminals each having connected to it the anode end of a diode equivalent device. The cathode ends of each of the diode equivalent devices are connected together to a positive DC output terminal. Each AC input terminal also has connected to it one end of a switching device. The other ends of each of the switching devices are connected together to a negative DC output terminal. The control means of the switching devices are connected such that only one conducts during any AC half cycle to provide a return path from the negative DC output terminal to the proper one of the two AC input terminals.

6 Claims, 2 Drawing Sheets

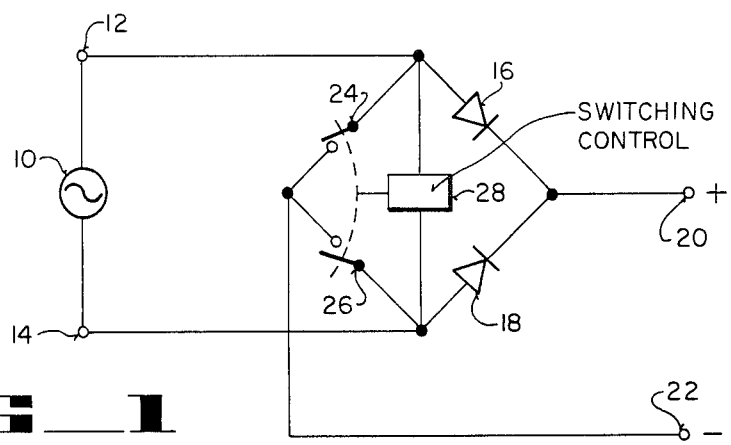
FIG_1
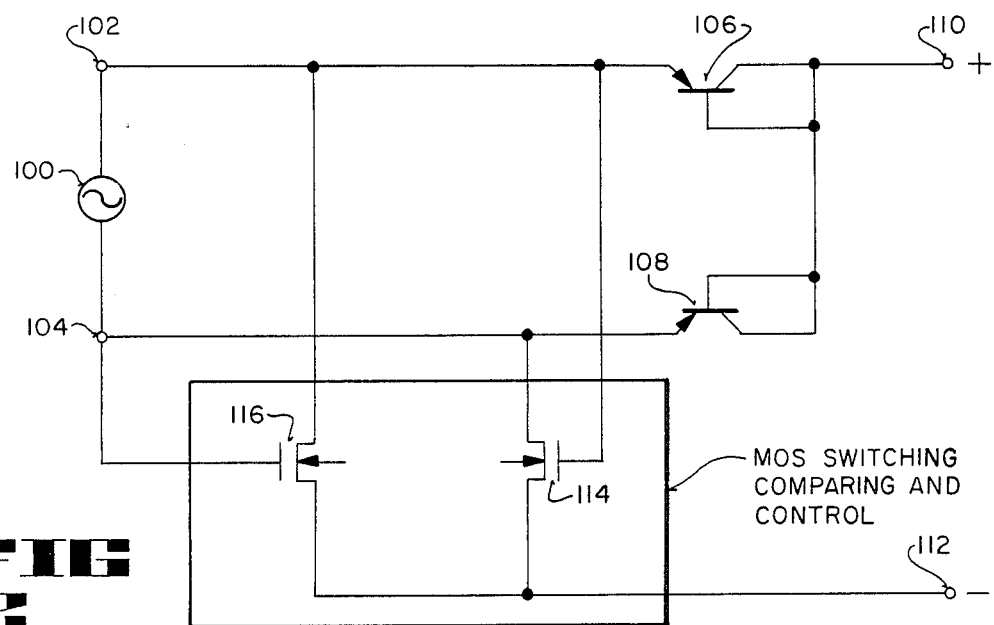
FIG_2
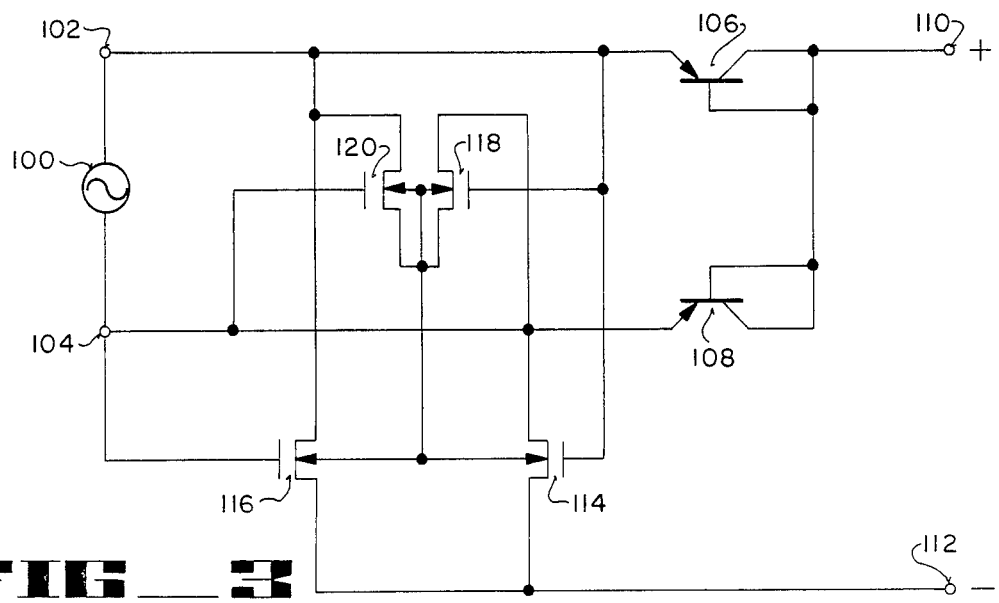
FIG_3

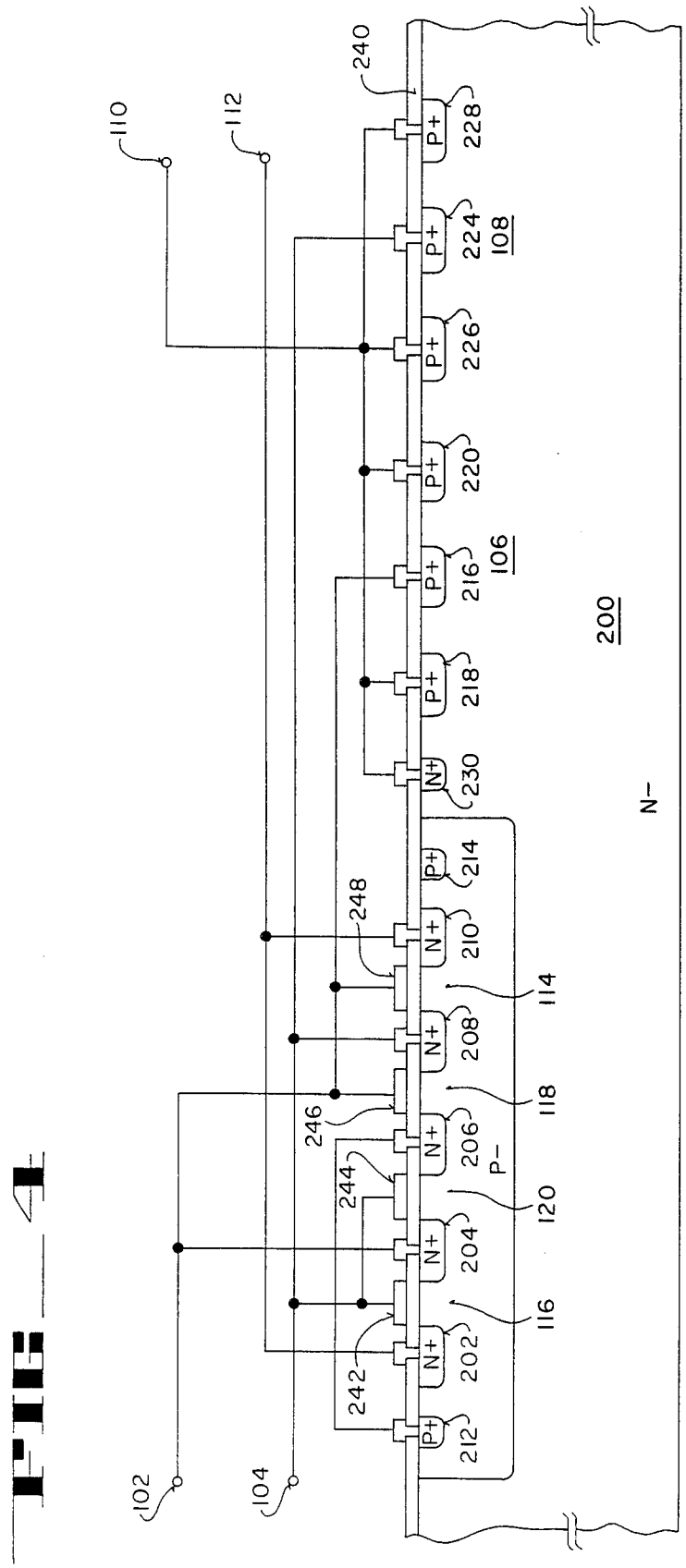

INTEGRATED FULL-WAVE RECTIFIER CIRCUIT

This is a continuation, of application Ser. No. 696,372, filed Jan. 30, 1985, now abandoned.

BACKGROUND OF THE INVENTION

1. Field of the Invention

The present invention relates to rectifier circuits, more particularly full-wave rectifier circuits, which are integrable on the same piece of semiconductor substrate material as the circuitry which they power.

2. The Prior Art

One of the most common circuit functions is that of the rectifier or diode. A diode will pass current of one polarity and will block current of the reverse polarity. Most electronic circuitry requires current and voltage of a defined polarity for correct operation and yet, electrical power is almost uniformly distributed throughout the world in each country by means of AC grids operating with 50 to 60 Hz voltage sine waves.

Consequently, almost every piece of electronic equipment obtaining power from centrally-distributed power systems requires a means of converting AC power to DC power. This equipment includes data processing equipment, communications equipment and domestic appliances and a host of other devices. Usually this conversion from AC to DC power is achieved using multiple diodes in either a full-wave or half-wave configuration.

Rectifier circuits are well-known for converting AC to DC. A half-wave rectifier system only converts AC power to a DC output during the period that the AC signal is one polarity whereas the full-wave rectifier provides a DC output during either polarity swing of the AC input voltage. In many cases the full-wave system is preferable because of lower peak current since it conducts for twice the time on both positive and negative excursions of the AC input signal. It thus has reduced smoothing requirements since the AC ripple on the output is at twice the AC input frequency of the half-wave rectifier. This results in lower system costs.

The recent miniaturization revolution has been brought about by introduction of the integrated circuit, which incorporates a plurality of semiconductor devices on the same piece of semiconductor substrate material. Integrated circuit elements have found their way into use in many products; refrigerators, washing machines, microwave ovens and television sets are but a few of the many products which incorporate microprocessors to enhance their functionality. Many if not most of these products take power from the AC power supply to homes and businesses. At power levels in the neighborhood of 1 watt or less it becomes economically advantageous to integrate a rectifier or complete power supply onto the same semiconductor substrate as the circuitry it drives.

The provision of integrated components and subassemblies make these products easier and more economical to produce. The function of the full-wave rectifier, although simple in concept, has to date been extremely difficult to integrate using any of the common junction isolated semiconductor integrated circuit technologies because of interaction between the four diodes. To date, most full-wave rectifier bridges or other full-wave rectifier circuits contain four individual diodes connected to a four lead package. There thus exists the need for a diode equivalent full-wave rectifier circuit which can be integrated on the same semiconductor substrate as all or a portion of the circuitry which it drives.

SUMMARY OF THE INVENTION

A four terminal integrateable full-wave rectifier circuit is disclosed having two input terminals and two output terminals. The anode end of a first diode equivalent device is connected to a first one of the input terminals. The anode end of a second diode equivalent device is connected to a second one of the input terminals. The cathode ends of the two diode equivalent devices are connected together at the positive DC output terminal. The negative DC output terminal has connected to it one end of each of two switching devices. The other end of one of the switching devices is connected to one of the AC input terminals and the other end of the other switching device is connected to the other AC input terminal. The control elements of the switching devices are connected so as to provide a return current path to the AC supply via one of the two AC input terminals onto only the appropriate one of the two supply conductors for that AC half cycle.

In a preferred embodiment using CMOS technology the diode equivalent devices are PNP transistors and the switching devices are N-Channel MOS (metallic oxide semiconductor) transistors. In this embodiment the substrate connections of the MOS switches are further connected through a secondary switching network consisting of N-Channel MOS transistors such that the substrates are always connected to the most negative voltage in the circuit.

BRIEF DESCRIPTION OF THE DRAWINGS

FIG. 1 is an oversimplified schematic diagram of a preferred embodiment of the present invention showing the major elements in a representative manner.

FIG. 2 is a more detailed schematic diagram of a preferred embodiment of the present invention.

FIG. 3 is a more detailed schematic diagram of a preferred embodiment of the present invention further illustrating the biasing of the substrates of the MOS switching devices.

FIG. 4 is a semiconductor profile diagram of a CMOS preferred embodiment of the present invention.

DESCRIPTION OF THE PREFERRED EMBODIMENT

Referring first to FIG. 1, an oversimplified schematic diagram of a preferred embodiment of the present invention, a source of alternating current (AC) power 10 is applied to two input terminals 12 and 14 of the rectifier circuit of the present invention. On alternating half cycles when either terminal 12 or terminal 14 is positive with respect to the other terminal, either diode equivalent 16 or diode equivalent 18 pass positive current flow to DC output terminal 20.

More particularly, if AC input terminal 12 is more positive than AC input terminal 14, current flows from AC input terminal 12, through forward-biased diode equivalent 16 through positive DC output terminal 20, through the load (not shown) and back to negative DC output terminal 22. Current does not flow through diode equivalent 18 because it is reverse-biased. If, however, AC input terminal 14 is more positive than AC input terminal 12, current will flow from AC input terminal 14, through forward-biased diode equivalent 18, through positive DC output terminal 20, through the load (not shown), and back to negative DC output terminal 22.

After the current passes back into the rectifier circuit of the present invention via terminal 22 it flows back to either AC input terminal 12 or 14 as appropriate via one of switches 24 or 26. Switches 24 and 26 are controlled by switching control 28 which, during each half cycle, senses which of terminals 12 or 14 is more negative than the other and appropriately closes the proper switch 24 or 26 to provide a return current path to the proper place during that half cycle. Those of ordinary skill in the art will readily note that switches 24 and 26, and switching control 28, replace conventional PN junction diodes in what would otherwise be a well-known full-wave diode bridge circuit.

In the following discussion with respect to the remaining drawing figures herein, reference will be made to various MOS (metallic oxide semiconductor) transistor devices. In naming the terminals of these devices, certain conventions will be employed herein. Source and drain terminals of these devices are interchangeable and will be named according to the following convention. With respect to N-Channel devices, the most positive of the channel connections at any given time will be called the drain; the most negative of these terminals will be called the source. With respect to P-Channel devices, the opposite will be true. The N-Channel MOS transistors disclosed herein are enhancement types which will turn on when gate to source voltage is positive and greater than zero.

Referring now to FIG. 2, a more detailed schematic diagram of a preferred embodiment of the present invention, source of AC power 100 is shown connected to AC input terminals 102 and 104 of the full-wave rectifier circuit of the present invention. When terminal 102 is positive with respect to terminal 104, current is conducted through PNP transistor 106, which has its collector and base connected together, and current passes to positive DC output terminal 110. After proceeding through the load (not shown) the current returns through negative DC terminal 112, switching device 114 back to AC input terminal 104. In a presently preferred embodiment, switching devices 114 and 116 are MOS N-Channel transistors.

The gate of MOS N-Channel device 114 is shown connected to AC input terminal 102. MOS N-Channel device 116 does not provide a return path to AC terminal 102; it is turned off since its gate is connected to AC input terminal 104. During this half cycle AC input terminal 102 is negative with respect to terminal 112, to which the source is connected of N-Channel device 114. Since the gate of N-Channel device 114 is positive with respect its source, it turns on.

During the AC half cycle when AC input terminal 104 is positive with respect to AC input terminal 102, current flows through PNP transistor 108, (its base connected to its collector like PNP transistor 106) through positive DC output terminal 110, and through the load (not shown). However, during this AC half cycle the return path from negative DC output terminal 112 to the AC power source is through N-Channel device 116 and AC input terminal 102.

The gate of N-Channel device 116 is connected to AC input terminal 104 which is more positive than AC input terminal 112 during this half cycle. The source of N-Channel device 116 is connected to negative DC output terminal 112. Likewise, N-Channel device 114 is off because its gate, connected to AC input terminal 102, is more negative than its source which is connected to AC terminal 112.

It is to be noted that in the embodiment of the circuit illustrated in FIG. 2, the substrate connections of N-Channel devices 114 and 116 are shown unconnected. In actual circuit implementation the substrate terminals of devices 114 and 116 will have to be connected to the most negative voltage in the circuit, i.e., whichever one of AC input terminals 102 or 104 is the most negative during a given AC half cycle. Provision for this is disclosed and discussed with respect to FIG. 3.

Referring now to FIG. 3, it will first be observed that FIG. 3 is identical to FIG. 2 but additionally includes N-Channel devices 118 and 120. The drains of devices 118 and 120 are commonly connected to the substrates of devices 114, 116, 118 and 120. The source of device 118 is connected to AC input terminal 104 and the source of N-Channel device 120 is connected to AC input terminal 102.

The circuit of FIG. 3 operates exactly as disclosed with reference to FIG. 2. In addition, N-Channel devices 118 and 120 will be disclosed.

During the half cycle when AC input terminal 102 is positive with respect to AC input terminal 104, the DC current return path from the load through from negative DC output terminal 112 will be through N-Channel device 114 and back to AC input terminal 104. During this half cycle the most negative voltage in the circuit will be negative AC input terminal 104. During this half cycle the gate of N-Channel device 118, connected to AC input terminal 102, will be positive with respect to its source which is connected to AC input terminal 104. Therefore, N-Channel device 118 will conduct. N-Channel device 120, on the other hand, has its source connected to AC input terminal 102 and its gate connected to AC input terminal 104. Therefore, it will be turned off. The substrates of N-Channel devices 114, 116, 118 and 120 will be connected to AC input terminal 104, the most negative point in the circuit, during this half cycle.

When, however, AC input terminal 104 is more positive than AC input terminal 102, the current return path from negative DC output terminal 112 will be through N-Channel device 116 to AC input terminal 102. In this case, N-Channel device 120 turns on, since its gate is connected to AC input terminal 104 which is now more positive than its source connected to AC input terminal 102. The substrates of devices 114, 116, 118 and 120 will be connected to AC input terminal 102, the most negative voltage in the circuit during this half cycle. N-Channel device 118 will be turned off since its gate is connected to AC input terminal 102 which is more negative than AC input terminal 104 to which its source is connected.

Referring now to FIG. 4, a semiconductor profile drawing of a CMOS preferred embodiment of the full-wave rectifier of the present invention, the structure and a process for making the present invention will be discussed. The process begins with lightly-doped N-type silicon substrate material 200. After preparation and other well-known front end steps such as the formation of P well 201, conventional masking and doping steps are used to form heavily-doped P+ and N+ regions which will form the active regions of the devices.

N+ region 202 forms the source for device 116. N+ region 204 forms the drain for N-Channel device 116 as well as the source for N-Channel device 120. N+ region 206 forms the drain of N-Channel device 120 and the source of N-Channel device 118. N+ region 208 forms the drain of N-Channel device 118 and the source of N-Channel device 114. N+ region 210 forms the drain of device 114. P+ region 212 forms the drain of device 114. P+ region 212 forms the contact for the common substrates for devices 114, 116, 118 and 120. P+ region 216 forms the emitter for PNP device 106. P+ regions 218 and 220 form the collector for that device. Similarly, P+ region 224 forms the emitter for PNP device 108 and P+ regions 226 and 228 form the collector for that device. N+ region 230 forms the base connection common to both device 106 and 108. It is to be noted that the collector regions form guard rings and completely surround the emitter regions in order to collect all minority carriers which are injected into the semiconductor substrate by forward biasing of the PN junctions formed by regions 216 and 200 and 224 and 200.

After the active regions have been suitably doped, a gate oxide layer 240 is grown over the entire surface of the semiconductor substrate. After the oxide has been grown, conventional masking, metal deposition, and etching steps are used to form the gates and the contacts. More specifically, region 242 forms the gate for device 116; region 244 forms the gate for device 120; region 246 forms the gate for device 118 and region 248 forms the gate for device 114.

Regions 250 form the contacts which are used to connect together the active regions in the substrate.

Those of ordinary skill in the art will recognize that the voltage on N+ region 230 will always be more positive than the P regions 201, 216, 218, 220, 224, 226 and 228, thus insuring that all PN junctions created between the substrate and these P regions are at all times reverse biased.

After the gate and contact regions are formed, a protective non-conducting layer is deposited over the surface of the semiconductor substrate as is well known in the art. Then well known steps are used to form one or more metallization layers which will serve as the interconnections between the active elements of the substrate.

While a disclosure of typical steps in a CMOS process has been included herein for completeness, such steps are conventional and are well understood by those of ordinary skill in the art. Additionally, although the preferred embodiment has been disclosed with respect to silicon substrates, those of ordinary skill in the art will readily appreciate and comprehend how other materials may be used.

While the present invention has been disclosed as a preferred P-well CMOS embodiment, those of ordinary skill in the art will readily appreciate that other combinations and technologies such as N-well CMOS and others may be employed without departing from the spirit of the invention as expressed in the appended claims, which are intended to cover all such obvious modifications.

What is claimed is:

1. A full-wave AC to DC power conversion circuit, including:
    a first and a second AC voltage input terminal,
    two diode-equivalent devices, one having its anode end connected to said first AC voltage input terminal, the second one having its anode end connected to said second AC voltage input terminal, said diode-equivalent devises having their cathode ends connected together to a positive DC voltage output terminal,
    a first MOS switching device connected between said first AC voltage input terminal and a negative DC voltage output terminal,
    a second MOS switching device connected between the second one of said AC voltage input terminal and said negative DC voltage output terminal,
    said first and second MOS switching devices including
    (1) comparing means for sensing whether said first or said second AC voltage input terminal is negative with respect to the other, and
    (2) switch control means, responsive to said comparing means, for closing the one of said first or second switching devices which is connected to the most negative of said AC voltage input terminals,
    said circuit integrated as a monolithic integrated circuit.

2. The full-wave AC to DC power conversion circuit of claim 1 wherein:
    said two diode equivalent devices are lateral PNP transistors, the emitter of each of said transistors forming the anode of each of said diode equivalent devices, the base and the collector of each of said PNP transistors connected together to form the cathode of each of said diode-equivalent devices, and,
    said first and second switching devices are N-channel MOS transistors.

3. The full-wave AC to DC power conversion circuit of claim 2 including switching means for connecting the substrates of said first and seocnd N-channel MOS transistors to the one of said first and second AC voltage input terminals which is the most negative.

4. The full-wave AC to DC power conversion circuit of claim 1 wherein:
    said first and second MOS switching devices include first and second MOS N-channel transistors,
    said first N-channel MOS transistor has its source connected to said first AC voltage terminal, its drain connected to said negative DC output terminal and its gate connected to said second AC voltage input terminal, and
    said second MOS N-channel transistor has its source connected to said second AC input terminal, its drain connected to said negative DC output terminal and its gate connected to said first AC input terminal.

5. The full-wave AC to DC power conversion circuit of claim 1, wherein:
    said two diode-equivalent devices are lateral PNP transistors, the emitter of each of said transistors forming the anode of each of said diode equivalent devices, the base and the collector of each of said PNP transistors connected together to form the cathode of each of said diode-equivalent devices,
    said first and second switching devices, and said comparing means includes a first and a second MOS N-channel transistor, said first N-channel MOS transistor having its source connected to said first AC voltage input terminal, its drain connected to said negative DC output terminal and its gate connected to said second AC voltage input terminal, and said second N-channel MOS transistor having its source connected to said second AC input terminal, its drain connected to said negative DC output terminal, and its gate connected to said first AC input terminal.

6. The full wave AC to DC power conversion circuit of claim 5, further including switching mens for connecting the substrates of said first and second N-channel MOS transistors to the one of said first and second AC input terminals which is the most negative.

* * * * *